United States Patent [19]
Bennin et al.

[11] Patent Number: 5,491,597
[45] Date of Patent: Feb. 13, 1996

[54] GIMBAL FLEXURE AND ELECTRICAL INTERCONNECT ASSEMBLY

[75] Inventors: Jeffry S. Bennin, Hutchinson; Todd Boucher, Stewert, both of Minn.; Jeffrey W. Green, Sioux Falls, S. Dak.; Gary E. Gustafson, Darwin, Minn.; Ryan Jurgenson, Hutchinson, Minn.; Brent D. Lien, Minneapolis, Minn.

[73] Assignee: Hutchinson Technology Incorporated, Hutchinson, Minn.

[21] Appl. No.: 227,960

[22] Filed: Apr. 15, 1994

[51] Int. Cl.$^6$ .............................. G11B 5/54; G11B 21/18
[52] U.S. Cl. .................. 360/104; 360/105; 360/108; 369/126
[58] Field of Search ........................ 360/104, 105, 360/103, 108; 369/126

[56] References Cited

U.S. PATENT DOCUMENTS

| | | | |
|---|---|---|---|
| 4,337,536 | 6/1982 | Taylor | 369/126 |
| 4,543,295 | 9/1985 | St. Clair et al. | |
| 4,616,279 | 10/1986 | Poorman | 360/103 |
| 4,645,280 | 2/1987 | Gordon et al. | 339/17 F |
| 4,670,804 | 6/1987 | Kant et al. | 360/102 |
| 4,761,699 | 8/1988 | Ainslie et al. | 360/103 |
| 4,789,914 | 12/1988 | Ainslie et al. | 360/103 |
| 4,792,875 | 12/1988 | Ohdaira | 360/104 |
| 4,801,765 | 1/1989 | Moyer et al. | 29/327 X |
| 4,811,143 | 3/1989 | Ohashi et al. | 360/105 |
| 4,819,094 | 4/1989 | Oberg | 360/104 |
| 4,823,217 | 4/1989 | Kato et al. | 360/104 |
| 4,827,376 | 5/1989 | Voss | 29/827 X |
| 4,839,232 | 6/1989 | Morta et al. | |
| 4,853,811 | 8/1989 | Brooks, Jr. et al. | 360/103 |
| 4,884,155 | 11/1989 | Spash | 360/105 |
| 4,975,795 | 12/1990 | Spash | 360/104 |
| 4,991,045 | 2/1991 | Oberg | 360/104 |
| 4,996,623 | 2/1991 | Erpelding et al. | 360/104 |
| 5,001,583 | 3/1991 | Matsuzaki | 360/104 |
| 5,003,420 | 3/1991 | Hinlein | 360/104 |
| 5,006,946 | 4/1991 | Matsuzaki | 360/104 |
| 5,012,368 | 4/1991 | Bosier et al. | 360/104 |
| 5,027,239 | 6/1991 | Hagen | 360/104 |
| 5,052,105 | 10/1991 | Mische et al. | 29/883 |

(List continued on next page.)

FOREIGN PATENT DOCUMENTS

| | | |
|---|---|---|
| 1329261 | 5/1994 | Canada . |
| 0484906A2 | 5/1992 | European Pat. Off. . |
| 0599669A2 | 1/1994 | European Pat. Off. . |
| 53-19015 | 2/1978 | Japan . |
| 53-30310 | 3/1978 | Japan . |
| 53-74414 | 7/1978 | Japan . |
| 57-167162 | 10/1982 | Japan . |
| 60-246015A | 5/1985 | Japan . |
| 4146516 | 5/1992 | Japan . |
| WO93/15593 | 8/1993 | WIPO ............... H95K 1/00 |

OTHER PUBLICATIONS

Reidenbach, IBM Technical Disclosure Bulletin, vol. 22 No. 4, Sep. 1979, pp. 1602–1603.

Hetke, et al., "Flexible Silicon Interconnects for Microelectromechanical Systems, 1991 International Conference on Solid–State Sensors and Actuators," Digest of Technical Papers, pp. 764–767.

*Primary Examiner*—John H. Wolff
*Attorney, Agent, or Firm*—Faegre & Benson

[57] ABSTRACT

A gimbal flexure and electrical interconnect assembly for attachment to a disk drive suspension assembly. The gimbal flexure and electrical interconnect acts both as an interconnect system for relaying electrical signals and as a gimbal flexure. It comprises a self-supporting set of generally parallel traces—electrically insulated linear substrate-free conductors constructed of a single layer spring material. The set of traces includes a load beam portion extending over and matching the surface topology of at least a section of the first surface of a load beam, and a gimbal portion located at a distal end of the set of traces shaped as a gimbal flexure means. The invention describes specific embodiments, including head harnesses, suspension assemblies, and head suspension assemblies, as well as manufacturing methods.

16 Claims, 10 Drawing Sheets

U.S. PATENT DOCUMENTS

| | | | |
|---|---|---|---|
| 5,055,969 | 10/1991 | Putnam | 361/398 |
| 5,068,759 | 11/1991 | Matsuzaki | 360/103 |
| 5,074,029 | 12/1991 | Brooks, Jr. et al. | 29/603 |
| 5,103,359 | 4/1992 | Marazzo | 360/104 |
| 5,111,351 | 5/1992 | Hamilton | 360/104 |
| 5,121,273 | 6/1992 | Slezak | 360/104 |
| 5,124,864 | 6/1992 | Matsuzaki | 360/104 |
| 5,166,845 | 11/1992 | Thompson et al. | 360/103 |
| 5,249,092 | 9/1993 | Russell-Smith et al. | 360/104 |
| 5,274,911 | 1/1994 | Toro | 29/827 |
| 5,391,842 | 2/1995 | Bennin et al. | 360/108 X |

GIMBAL FLEXURE AND ELECTRICAL INTERCONNECT ASSEMBLY

CROSS-REFERENCE TO RELATED APPLICATIONS

The present application is related to a application entitled ELECTRICAL TRACE INTERCONNECT ASSEMBLY filed concurrently with the present application.

BACKGROUND OF THE INVENTION

Head suspension assemblies (HSA) in rotatable data storage devices are spring structures that perform the difficult task of accurately holding and positioning a floating head assembly nanometers away from the rapidly spinning irregular surface of a rotatable data storage device. The HSA can be part of a magnetic hard disk drive, the most common today, or other type of drives such as an optical disk drive.

A HSA comprises different elements, the most common being a suspension assembly and a head assembly. A suspension assembly, the spring element, usually includes a load beam and a gimbal, each composed of a carefully balanced combination of rigid regions and flex spring regions. A typical head assembly usually includes a "head", comprising of a highly sensitive read/write transducer, that is attached to an air bearing slider.

In a magnetic disk drive, a write transducer transforms electrical pulses to small magnetic fields which it then "writes" on a magnetic disk. A read transducer decodes these magnetic fields back into electrical pulses. The order of the magnetic fields and their subsequent orientation, aligned along the circumference of the disk in north-south configuration, defines a bit code that the transducer detects as the head floats on a cushion of air over the magnetic disk. The head assembly includes electrical terminals to send and receive these electrical pulses.

A HSA generally attaches at its proximal end to a rigid arm manipulated by a linear or rotary motion actuator designed to position the head at any radial location above the disc. The spinning disk coupled with the actuator movement allows the head to gain access to multiple tracks across the disk surface, each track capable of containing large amounts of densely stored data. Positioned at the distal end of a suspension assembly, a gimbal holds the head assembly level and at a constant distance over the contours of the disk.

This gimbal is the most critical of the spring regions in a HSA. The closer the head assembly can fly to the surface of a magnetic disk, the more densely can information be stored (the strength of a magnetic field is proportional to the square of the distance, thus the closer the head flies the smaller the magnetic "spot" of information). Today's disk drives strive to reach flying clearances close to 100 nanometers=0.1 micrometers (a human hair is about 100 micrometers thick). Greater data densities allow for greater storage and smaller size. But the head assembly must not touch the disk ("crash"), as the impact with the rapidly spinning disk (rotating at about 3600 rpm or faster) could destroy both the head and the surface of the disk, along with the data stored on it.

In order to achieve this delicate and precise positioning, a suspension assembly, and specially the gimbal flexure, must carefully balance the load applied to the head assembly against the upward lift of the air stream on the slider. Since at this microscopic level the seemingly smooth surface of the disk is full of peaks and valleys, the gimbal spring must be very responsive in order to maintain a level flying height. To avoid delays and errors, it must also resist torsion and momentum forces, and maintain the head parallel to the surface even after rapid repositioning movements. The best suspension assemblies are low in mass, to reduce momentum on the floating head, and very flexible along the Z-axis, to quickly adjust to surface undulations. They also are balanced carefully to reduce static roll and pitch to acceptable levels and to avoid applying an initial twist to the head.

A conventional gimbal flexure, sometimes referred to as a Watrous gimballing flexure design, is formed from a single sheet of material and includes a pair of outer flexible arms about a central aperture, with a cross piece extending across and connecting the arms at a distal end of the flexure. A flexure tongue is joined to the cross piece and extends from the cross piece into the aperture. A free end of the tongue is centrally located between the flexible arms. The slider is mounted to the free end of the flexure tongue. The slider must be mounted to the flexure tongue so that the head assembly is in a predetermined (e.g., planar and parallel) relationship to the disk surface to assure accuracy and overall planarity.

As the head writes and reads to and from the disk, it receives and sends electrical pulses of encoded information. Complex head assemblies may require four or more different input and output terminals. The electrical signals are relayed to appropriate amplifying and processing circuitry. Signal transmission requires conductors between the dynamic "flying" slider and the static circuitry of the data channels. However, while conductors can be routed fairly easily along the rigid actuator arm, providing the final interconnections through the suspension assembly, and specially those over the gimbal to the head, is often extremely troublesome with current interconnect schemes.

Specially designed HSA interconnect assemblies are required in order to relay electrical signals accurately while not disturbing the precise balance of the HSA components. The term interconnect assembly refers to the entire interconnect system in a HSA, including conductors, insulators, and other features. In order to assure data precision, interconnect assemblies must transmit the electrical signals free from interference or signal loss due to high inductance, high capacitance, or high resistance. Optimal interconnect assemblies must be attached securely in order to reduce movement and vibration which cause varying electrical characteristics and affect mechanical performance. They must have low resistance and be well insulated from electrical ground.

Also, as technology advances, an interconnect system also must be capable of handling a plurality of signals. A basic interconnect assembly for a transducer having a single read/write inductive element calls for two conductors. More complex transducer designs may incorporate a separate magneto-resistive read element and an inductive write element, thus requiring a minimum of 3 conductors if the elements are tied together or a minimum of 4 conductors if the elements are completely separate. More advanced systems require even more conductors.

The problem is that in a HSA, interconnect assemblies must be planned around competing and limiting design considerations. The interaction of all the elements of an HSA forms a carefully balanced system. An ideal interconnect assembly must satisfy strict mechanical and manufacturing requirements.

First, an interconnect assembly must not impose unpredictable loads and biases which might alter the exact positioning of the head assembly, nor must it detract from the ability of the spring regions to adjust to variations in the surface of the disk, vibrations, and movement. Alterations to the flying height of the head can significantly affect data density and accuracy and even destroy the system in a crash. Neither of these two results would be well received by computer users.

Rigidity increases in relation to the third power of cross-sectional thickness. To respond to air stream changes and to hold a floating head, suspension assemblies are very thin and light, specially around the sensitive spring areas. A thick conductor placed atop of a thin suspension will dramatically increase a spring region's stiffness. Moreover, overshoot errors caused by inertial momentum are also affected by thick, high-in-mass conductors. Therefore, the ideal interconnect assembly must be low in mass and be very thin. As an additional requirement, interconnects placed over spring regions must not plastically deform when the region flexes, since that would hinder the return of the spring to its normal position and apply a load on the suspension assembly.

Since the gimbal region must adjust to minute variations in the surface of the disk, vibrations, and movement, this region is usually the thinnest and most delicate, and therefore the most affected. Because of the rigidity to thickness relation, even thin conductors placed atop the gimbal will greatly decrease the flexibility of a gimbal region.

A second set of design considerations comes from manufacturing constraints. Like any commercial product, interconnect assemblies must be efficient to manufacture. Additionally, they must mate well and easily with the suspension assembly, be resistant to damage, and have precise manufacturing tolerances. Complex shaping and mounting processes are costly and decrease the reliability of the whole HSA manufacturing process. Fragile electrical conductors or interconnects that have to be added to the suspension assembly early in the manufacturing process are more susceptible to damage by production steps. They drastically diminish the manufacturing useful output yield.

Exacting tolerances are necessary to avoid defects and unpredictable loads and biases, specially when dealing with such minute measurements and clearances. During the process of manufacturing and assembling the HSA and of attaching an interconnect system, any lack of precision in forming or assembling the individual elements contributes to a lack of planarity in the surfaces of the elements. A buildup of such deviations from tolerance limits in the individual elements can cause deviation from desired planar parallelism in the final head suspension assembly. The parameters of static roll and static pitch torque in the final HSA result from these inherent manufacturing and assembly tolerance buildups. As the industry transitions to smaller slider/transducer sizes to increase data storage density, limitations of the current interconnecting devices increase the potential for read/write errors and impose ceilings on data storage density.

Traditional Interconnect Systems

Traditional HSA interconnect systems use either wires or flex circuits. Wire interconnects utilize manually routed small insulated copper wires (44 AWG and greater) threaded into non-conductive PTFE tubing (0.25 mm–0.38 mm). The PTFE tube typically extends from the distal end of the suspension assembly along the center or the side rails, top or bottom surface of the suspension, to the proximal end of the suspension assembly and beyond. To avoid greatly reducing the dynamic performance and flight characteristics of the slider, only the fine inside wires are manually looped past the suspension and over the gimbal region out to the head's electrical terminals, to form a service loop.

Wires encased in tubular insulation sheaths (hereinafter wires) possess the advantage that they can be manufactured separately from the load beam and can be added in the final steps of manufacture. They also can adapt to a variety of HSA configurations and topographies and are fairly resistant to breakage and short circuits.

Wires cause problems due to their varying inductances, high profile, and demand for labor and machine intensive processes. Manual conductor routing along the suspension assembly and service loop, can induce unfavorable and unpredictable static slider bias or bias variability. Movement by loose wires causes variable electrical characteristics. Lack of orientation, placement, and spacing definition of free form twisted conductors at bond sites increases bias variability and bond positioning labor. Usage of suspension appendages termed "wire-crimps", to anchor PTFE tubular wire sheaths, have the potential of inducing stresses to the suspension that affect static roll and pitch. They also may damage the twisted conductors. Profile limitations imposed by PTFE tubing and wire crimp tabs can limit disk stack height. As the assembly of head suspensions becomes more automated, the manual routing of the tube and wire interconnect and the stresses they apply on the assembly pose an obvious constraint.

Even well positioned wires may affect the suspension assembly's stiffness and flexibility. The oxygen free copper usually used for the twisted wires has a very low yield strength and has a tendency to plastically deform during assembly and handling, subjecting the suspension assembly to unaccounted stresses. In addition, the constant diameter of the wire does not allow for changes in resistance or in thickness along certain regions of the suspension assembly. This imposes design limitations due to the trade-off between the fixed inherent electrical resistance (per unit length) of the wire and the need for reduced wire spring stiffness (a function to the fourth power of the wire diameter) along the flex regions.

Recent developments involve removing the PTFE tubing and using a twisted wire pair bonded in spots to the suspension assembly with an adhesive. This eliminates the added cost and height associated with the PTFE tubing. However, in order to ensure flatness, straightness, and to improve the repeatability and placement accuracy of tubeless wire interconnects, complex automated machinery, such as tensioning devices, is required.

Another common interconnect system uses electrical flex circuits. Electrical flex circuits are flat or round conductive wires laminated within plastic film layers. One of the most common flex circuit embodiments consists of a flat layer of soft copper approximately 18 micrometers to 35 micrometers thick placed on top of an insulating substrate, usually a polyimide material ≈25 micrometers thick.

Flex circuits may follow the surface topology of the suspension assembly and may be attached to the suspension assembly all along their length or in selected regions. The resistance along the path of the flex circuit can also be increased or reduced by increasing or reducing the width of the conductors as they transit through certain areas. Flex circuits can be placed on the suspension assembly by automation, have low profiles, controlled impedances, spaced leads, and favorable dynamic response.

Flex circuits do create several problems. The copper traditionally used in flex circuits is prone to plastic deformation, and may introduce unexpected loads on the HSA. The film substrates used within flexible circuitry lend a high stiffness value to the interconnect.

The substrate in a flex circuit functions both as an electrical isolator and as a base assembly aid/support. While a thin layer would suffice for electrical isolation, to function as base support the dielectric film has to be substantial enough to have some rigidity to allow handling and processing. The thick substrate necessary to support the copper conductors affects the rigidity and flexibility characteristics of the load beam and of the gimbal. Traditional load beams are ≈65 micrometers thick. The addition of a flex circuit ≈43 micrometers thick placed away from the neutral axis of bend of the load beam, more than quadruples the rigidity along the spring regions. This stiffness multiplying factor is even larger for a thin gimbal flexure. Since conductors usually run on only one side of the load beam, this increase in stiffness is also not symmetrical. A polyimide (the traditional substrate material) plate thick enough to act as a base greatly increases unwanted stiffness. Other traditional materials thin enough to reduce interconnect stiffness are difficult to work with and costly.

Finally, although profile, electrical performance, and automation compatible advantages of flexible circuitry prove better than those of wires, high volume manufacture of flex circuits lacks precision and is costly. Flex circuits are very difficult to manufacture to specifications similar to suspensions. Polyimide as used as a flex circuit substrate can be mass produced to feature tolerances of only ±50 micrometers. Exact shaping is difficult to achieve. Fine feature patterning techniques of the dielectric substrates (e.g., laser patterning, caustic etching, dry etching) are costly and difficult to implement for large scale production.

A third type of suspension assembly interconnect utilizes plastic compounds either complementing the function of (such as a thin film overlay) or acting as an integral element of the suspension assembly structure. The major problem with the use of plastic materials is that plastics do not possess optimal mechanical qualities for use in spring and gimbal construction. As the flying height and head size continually decrease in the progression towards greater disk storage density, the accuracy and control needed to align the transducer to the correct data track upon the disk surface follows suit. During operating conditions the drive temperature operating ranges may span 80 degrees Celsius. The use of thermally expansive plastics as structural elements of the load beam or gimbal region poses dimensional stability limitations. Heavily interweaved designs of the interconnect and suspension assembly lead to restrictive design constraints on the suspension assembly and/or rigid disk drive designers. Also, since the electrical conductors in flex circuits must be formed on the suspension assembly early in the manufacturing process, the conductors are susceptible to damage from the suspension assembly's manufacturing process. As a result, the final yield of usable head suspension assemblies is diminished.

Traditional Gimbal Flexures

There are a variety of different gimbal designs known in the art. Typical gimbal springs are either etched from thinner materials as separate entities from the load beam and then welded on the load beam or are manufactured in integrated format, partially etched from the thicker load beam material. In both formats, electrical isolation of the gimbal spring from the main load beam body is impossible. Both gimbal formats are susceptible to stiffness increases and loads caused by interconnect systems. The distorting effect of interconnect systems contributes to static pitch and roll torque errors. These errors become more critical as complex systems require more conductors and the head clearances diminish.

Obviously, new gimbal designs must take into account the interaction between the interconnect system and the gimbal flexure. Some new suspension assembly designs try to solve this problem by manufacturing integral conductors as part of plastic (usually polyimide) gimbal-like structures.

While the idea to make the electrical conductors an integral part of a head supporting device is certainly noteworthy, the use of plastic materials, as explained above, may not afford the desired dimensional stability in light of normal thermal changes. Moreover, plastic deformation due to creep of the polymeric materials increases the dimensional stability uncertainty. The hygroscopic (moisture absorption which expands material) nature of polymeric materials over variable humidity exposures may also serve to increase slider-transducer positional variance. Although spring damping with a polymeric suspension assembly may improve resonant characteristics in some HSAs, a gimbal design that minimizes or eliminates polymer use is preferable.

In conclusion, as today's data density requirements necessitate the head to fly even closer to the disk, there is less room for imprecise manufacturing and unaccounted loads or stiffness. An interconnect system must accurately transmit a plurality of signals, yet be efficient and precise to manufacture and to mount, have minimum mass, no increase in stiffness, and no plastic deformation, especially along the gimbal region.

SUMMARY

The present invention discloses a novel gimbal flexure and electrical interconnect assembly (gimbal-interconnect) and gimbal-interconnect harness, as well as an improved suspension assembly and head suspension assembly (HSA) that include the gimbal-interconnect. The gimbal-interconnect of the present invention offers a different approach to the problem of coupling an interconnect assembly to a gimbal. Rather than trying to minimize the interconnect assembly to reduce its effects on the gimbal, it provides an interconnect assembly that is so sturdy and self-supporting that it can itself be shaped to act as a gimbal. In addition, the gimbal-interconnect assembly offers good electrical performance, capability to handle a plurality of signals, and excellent mechanical characteristics. Moreover, the gimbal-interconnect and its related products are simple and efficient to manufacture and assemble.

The gimbal-interconnect is designed to become part of a disk drive suspension assembly in a rotating data storage device or hard disk drive. A suspension assembly includes a load beam and a gimbal. The load beam has a first surface on which to run the necessary conductors and a distal end portion shaped for attachment of a gimbal flexure. The suspension assembly and the gimbal-interconnect are both elements of a head suspension assembly (HSA).

The gimbal-interconnect of the present invention includes a set of traces, a set usually having two generally parallel traces. A trace is an electrically insulated linear substrate-free conductor constructed of a single layer spring material. Preferred materials have a tensile strength and a yield strength similar to those of the suspension assembly. A preferred material is beryllium copper. The set of traces includes a load beam portion extending over and matching the surface topology of at least a section of the first surface of the load beam and a gimbal portion. The gimbal portion is located at a distal end of the set of traces and acts as a gimbal flexure means. It can be shaped in a variety of gimbal designs for mechanically coupling with the distal end portion of the load beam, providing gimballing support for the floating head assembly, and electrically coupling to electrical terminals on the head assembly.

In many gimbal versions, the gimbal portion of the set of traces includes one or more torsion arms extending from the set of traces, at least one of said arms electrically insulated from the load beam. Each arm is shaped as a portion of a symmetrical gimballing spring pattern and has a distal end spreading into an enlarged horizontal bond pad that provides a contact surface for mechanical and/or electrical coupling of the head assembly. Connection tangs may protrude from the gimbal portion to facilitate electrical connections.

To transmit a plurality of signals, a multi-signal gimbal-interconnect can be manufactured by stacking sets of traces. Manufacturing methods for the gimbal-interconnect and suspension assemblies including etching or cutting the described elements and then bonding them together using a non-conductive adhesive.

BRIEF DESCRIPTION OF THE DRAWINGS

The features, aspects, and advantages of the present invention will become better understood with regard to the following description, appended claims, and accompanying drawings, where:

DETAILED DESCRIPTION

The gimbal-interconnect is designed to become part of a disk drive suspension assembly in a rotating data storage device or hard disk drive. It will perform two jobs, both as an interconnect and as a gimballing support to the head assembly.

A head suspension assembly (HSA) 10 is the combination of elements that positions a head assembly 12 over selected tracks of a rotating data storage device. The HSA 10 includes a suspension assembly and a head assembly 12. The suspension assembly includes a load beam 20 and a gimbal flexure and electrical interconnect assembly (gimbal-interconnect) 30. The term "interconnect assembly" refers to a whole interconnect system (including all of its features) that transmits electrical signals across the HSA 10. A gimbal flexure is the structure that suspends the head level over the surface of the spinning disk (not shown), even while the head suspension assembly pivots, inclines or bends. A head assembly 12 includes an air-bearing slider, a transducer, and electrical terminals 14.

Figure 1:
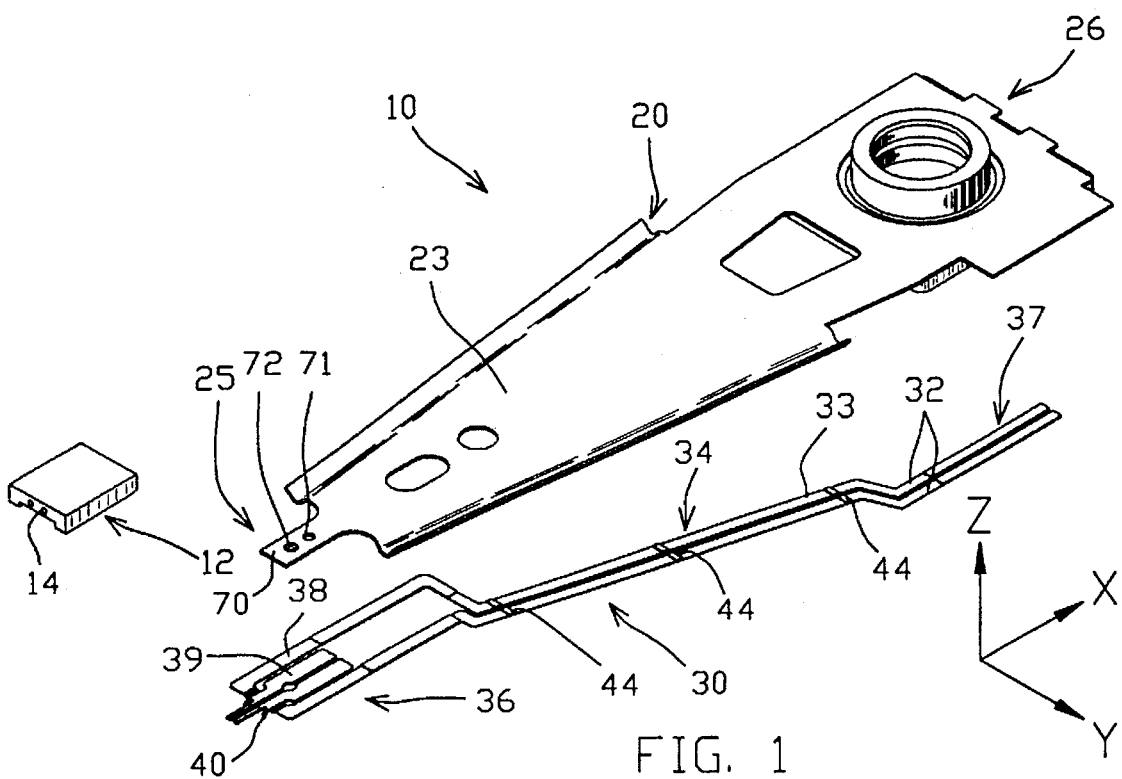
FIG. 1 is an exploded perspective view of a HSA, including a load beam and a gimbal-interconnect, embodying features described in the present invention.
Figure 3:
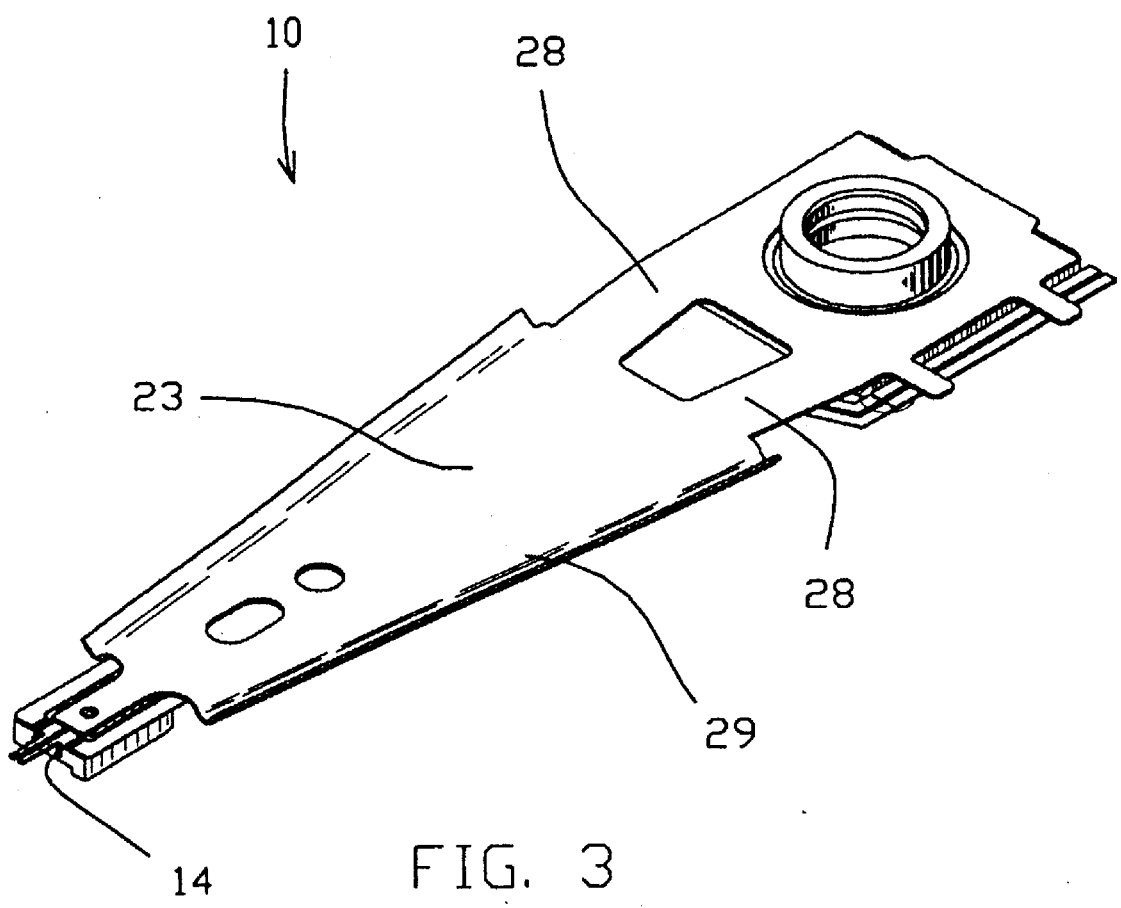
FIG. 3 is a perspective view of the assembled HSA of FIG. 1.
Figure 4:
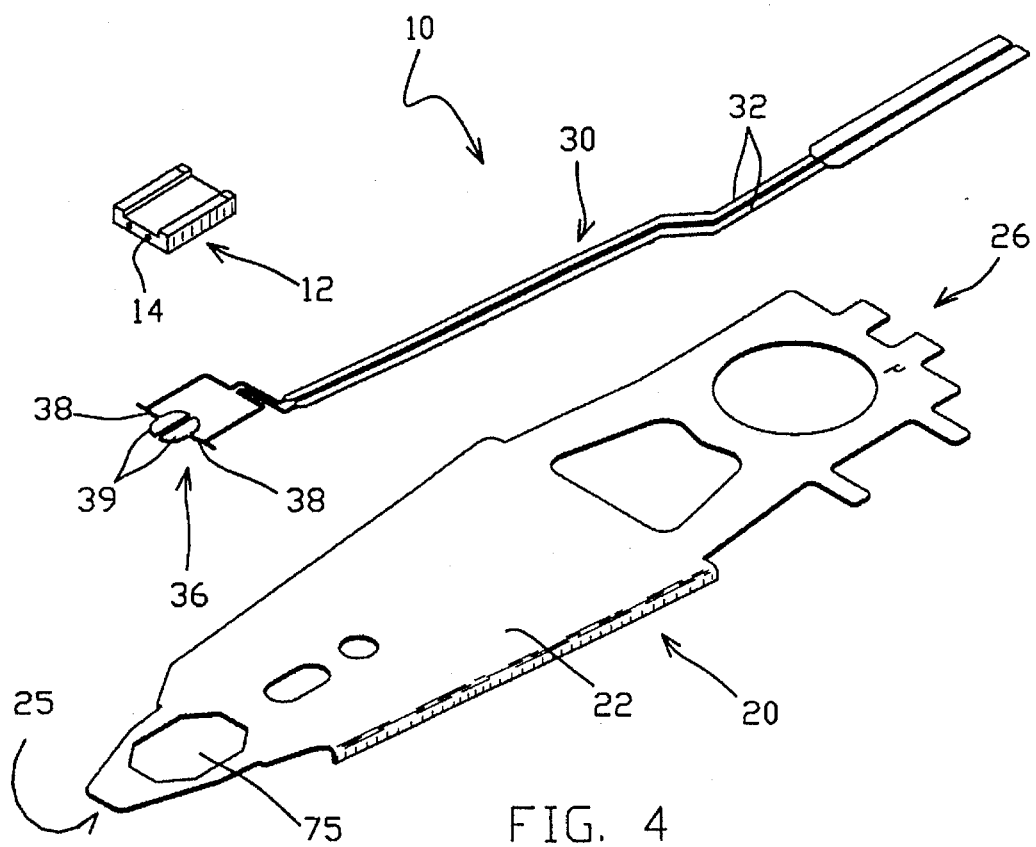
FIG. 4 is an exploded perspective view of another HSA format, including another load beam format and gimbal-interconnect format, all embodying features described in the present invention.
Figure 5:
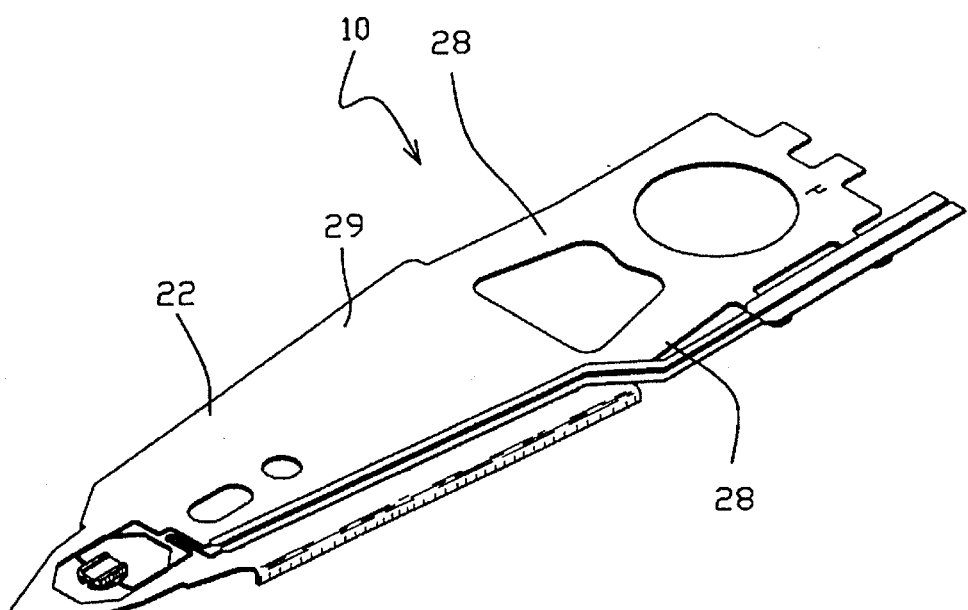
FIG. 5 is a perspective view of the assembled HSA of FIG. 4.
Figure 6:
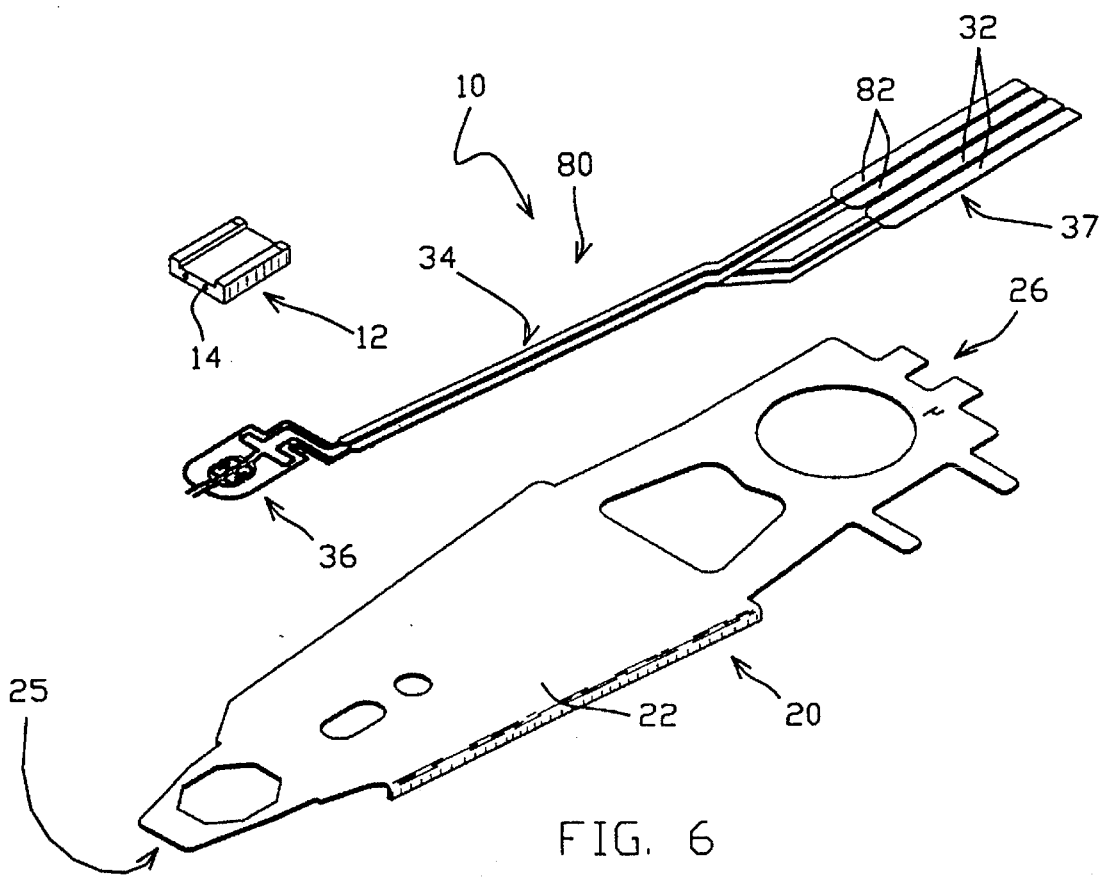
FIG. 6 is an exploded perspective view of a HSA, including the load beam format shown in FIG. 4 and a multi-signal gimbal-interconnect format, all embodying features described in the present invention.
Figure 8:
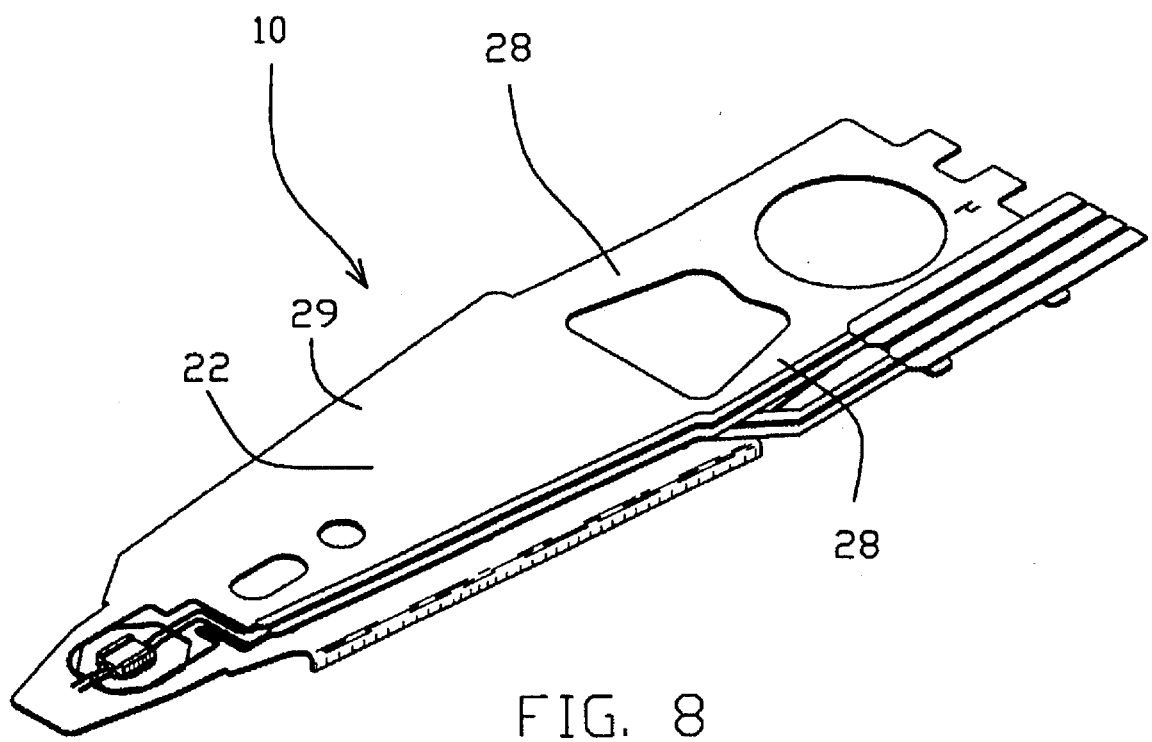
FIG. 8 is a perspective view of the assembled HSA of FIG. 6.

FIGS. 1, 4, and 6 show different elements of various head suspension assemblies (HSAs) 10 embodying elements of the present invention. FIGS. 3, 5, and 8 show how the different components all come together.

The different formats of load beams 20 in the drawings all have a first surface 22, shown in FIGS. 4, 5, 6, and 8 and a second surface 23, shown in FIGS. 1 and 3. The load beam 20 further includes a distal end portion 25 shaped to support a gimbal flexure, and a proximal end portion 26, that may be shaped for attachment to an actuator arm (not shown). The load beam has a spring region 28 adjacent to the proximal end portion 26, and a rigid region 29, located in between the spring region 28 and the distal end portion 25. The load beam 20 is preferably planar and made of stainless steel by methods known in the art. It can be etched, cut, stamped, or electrically discharged machined (EDM'd).

The gimbal-interconnect 30 of the present invention is constructed as a separate element to be attached later to a suspension assembly, specifically to the first surface 22 of the load beam 20 (customarily the side that will face the disk). The gimbal-interconnect 30 includes a set of traces 32, a set usually having two generally parallel traces 33 completing a circuit. The traces 33 are generally coplanar and placed side by side. The same circuit functions for both the read and write modes.

A trace 33 is an electrically insulated linear thin substrate-free conductor. It can be flexible, but is also resilient and can be pre-shaped to match different configurations. A cross-sectional cut of a trace 33, such as those in FIGS. 11A and 11B, generally reveals a rectangular cross-section. Nevertheless, it can be shaped in other low-profile cross-sectional shapes. Traces 33 are constructed of a single layer conductive spring material. Spring materials are those that do not plastically deform (yield) under the most extreme loads a gimbal endures during assembly and drive use. Preferred materials have a tensile strength and a yield strength similar to those of the suspension assembly where the tensile strength is typically a minimum of 1.1 gigapascals and the yield strength is typically a minimum of 1.0 gigapascals.

Traces made of preferred materials are usually self-supporting in the present format. Although the preferred manufacturing method is to photochemically etch them in series out of a long stripe of material, they can be stamped, EDM'd, or shaped by other processes known in the art.

A preferred material is a beryllium copper alloy (BeCu 172) with a yield strength close to 1.24 gigapascals and a tensile strength close to 1.31 gigapascals. The use of beryllium copper (BeCu) in traces is an inventive departure from traditional copper-only conductors. A high-tensile, high-yield strength material like BeCu makes the set of conductive traces 32 self-supporting and sturdy. Although previously overlooked because it is less conductive than pure copper, BeCu offers advantages over the present conductor materials by approximately matching the 1.14 gigapascal yield strength and 1.31 gigapascal tensile strength of the stainless steel used to define the typical suspension assembly. A high strength spring material that closely matches the spring characteristics of stainless steel under load greatly reduces the chance of subjecting the gimbal assembly to adverse shifts in the static attitude. Low strength, non-spring materials may easily yield during adverse handling and assembly operations, imparting unknown stresses to the suspension assembly, which invariably lead to shifts in the nominal static attitude of the gimbal flexure.

The set of traces 32 includes a load beam portion (or region) 34, a gimbal portion 36 and a connector portion 37. The load beam portion 34 extends over and matches the surface topology of at least a section of the first surface 22 of the load beam 20. The layout and exit position of the load beam portion 34 and connector portion 37 can adapt to different connection needs or to different features of the load beam 20.

The load beam portion 34 is shaped and arranged along a pattern defining the X, Y, and Z coordinate positioning required to mate with the load beam 20 without manual routing or manipulation. The gimbal-interconnect 30 can be detailed to mate with and to transit perfectly through a specific suspension assembly or be general enough to fit other standard suspension assemblies. FIGS. 1 through 8 show different formats of the gimbal-interconnect assembly 30 adapting to a variety of different suspension assemblies. In order to achieve an optimal fit, the surface topology of the load beam 20 is analyzed and the manufacturing model (e.g., etching mask or stamping press) is adjusted accordingly.

The gimbal portion 36 is located at a distal end of the set of traces 32 and acts as a gimbal flexure means for mechanically coupling with the distal end portion 25 of the load beam 20, providing gimballing support for the floating head assembly 12, and electrically coupling to the head assembly's electrical terminals 14. Virtually every gimbal design known in the art can be used. Since BeCu so resembles the yield and tensile properties of stainless steel, major adjustments to the dimensions are generally not necessary.

Although the traces can be shaped into almost any gimbal design, in the preferred versions the gimbal portion of the set of traces includes one or more symmetrical torsion arms 38 extending from the load beam portion 34, at least one of the torsion arms 38 electrically insulated from the load beam 20. Each torsion arm 38 is shaped as a part of a usually symmetrical gimballing spring pattern. The distal end of the arms spreads into an enlarged horizontal slider bond pad 39 that will provide an attachment contact surface for the head assembly 12. The bond pads can be designed just to offer mechanical connection and support to the head assembly 12 or to couple both mechanically and electrically to the electrical terminals 14 of certain kinds of head assemblies. These electrical couplings may use an electrically conductive epoxy as a bonding agent.

Figure 15:
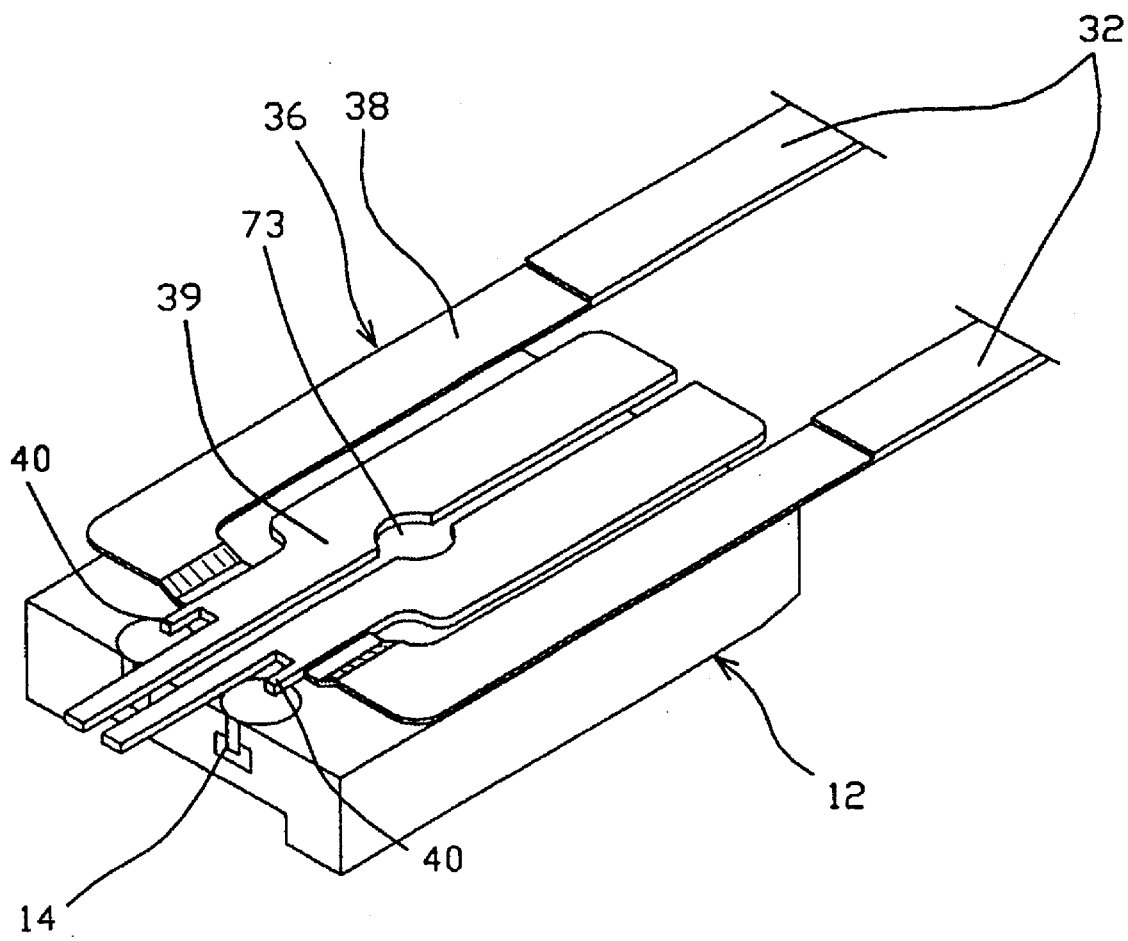
FIG. 15 is an enlarged detail view of the gimbal portion of a gimbal-interconnect assembly including straight tangs.

Connection tangs 40, essentially projecting prongs, may protrude from the gimbal portion 36 to facilitate connections to the head's electrical terminals 14. The tangs 40 depicted in FIG. 2 bend in a radial break and extend generally perpendicularly away from the set of traces 32, towards the head assembly 12. The tangs 40 facilitate connection to vertically mounted electrical terminals 14 and use known techniques, such as ultrasonic bonding. Other tang embodiments, such as that of FIG. 15, may be straight for connection to electrical terminals 14 mounted on the top of the slider. To improve the metallurgical requirements of the electrical bond sites, the base metal could be clad during the milling process or pattern plated with suitable contact metals such as gold, tin, solder, etc. for improved bonding results to electronics flex cable pads or to the head's electrical terminals 14.

The connector portion 37 is located at the proximal end of the set of traces 32. In this portion, the traces 32 may widen and extend past the load beam 20. This is done in order to offer a good connection surface to couple the set of traces 32 to other circuitry.

The gimbal-interconnect assembly 30 has other elements besides the set of traces 32. Once the set of traces 32 has been shaped, selected areas of each trace 33 are coated with a thin dielectric coating 42, shown in FIGS. 11A and 11B, suitable for electrical isolation from the load beam 20. The dielectric isolation coating 42 may be spray, dip, roll, or print coated to the set of traces 32. It may be applied in full trace format (to the entire conductor) or only to specific areas, such as the face in contact with the load beam 20, the slider bond pads 39, or integral standoffs 44 (FIG. 1).

Standoffs 44 are raised areas that separate the set of traces 32 from the load beam 20 in order to further improve the electrical characteristics of the trace gimbal-interconnect 30. Shaped as pegs, they are usually square, but may be fashioned in any shape. Integral standoffs 44, shown in FIG. 1, may protrude from the side of the set of traces 32 facing the load beam 20. They allow a cushion of air between the set of traces 32 and the load beam 20 to act as an additional dielectric layer and thus decrease the conductor to suspension ground distributed capacitance. Not only does the air cushion have excellent dielectric characteristics, but it does not add any additional mass to the trace gimbal-interconnect 30.

A suitable adhesive 43, may be applied atop the first dielectric coating 42 to facilitate lamination of the set of traces 32 to the load beam 20. The adhesive 43 could be pressure, heat, or ultra-violet light cured. It may be applied in full format which again coats the entire gimbal-interconnect 30 or in a partial format. The adhesive may be limited to the standoffs 44, their contact points, and/or to other selected regions such as bond pads 39. It may be applied in spray fashion or X-Y coordinate liquid dot fashion. A patterned corrosion protection coating 45 also may be applied to selected areas of the gimbal-interconnect 30.

Figure 11A:
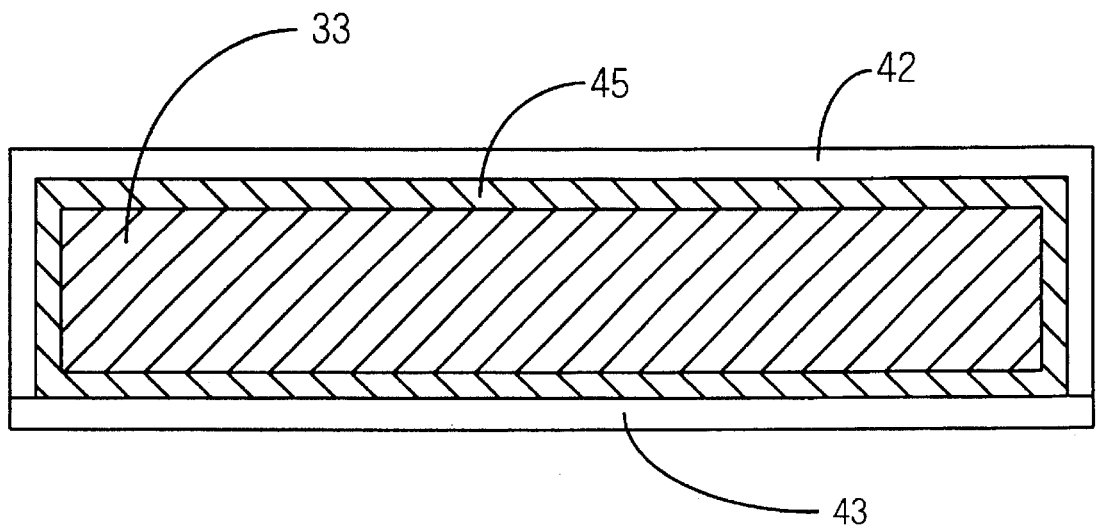
FIG. 11A is a much enlarged view of a cross-sectional cut of an embodiment of a conductive trace and added coatings.
Figure 11B:
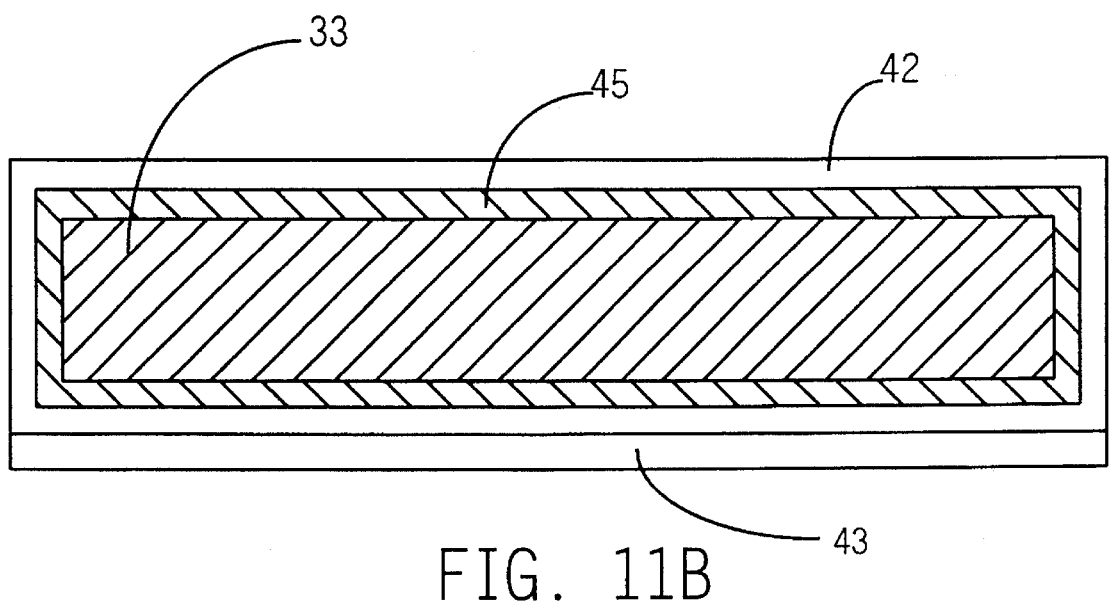
FIG. 11B is a much enlarged view of a cross-sectional cut of another embodiment of a conductive trace and added coatings.

The traces' profile and manufacturing steps can be reduced further by utilizing an adhesive that also acts as a dielectric, such as 3M's EC2290 epoxy. This dielectric/adhesive is spray coated onto the traces to a thickness of about 6.4 micrometers. The dielectric/adhesive coating can perform three jobs as it also acts as the corrosion coating. As shown by FIGS. 11A and 11B, the coatings can be applied in a variety of formats and in different order. The bond pads 39, the connector tangs 40, and any electrical connection points should be patterned or masked clear of insulation or adhesive to allow prepositioned, automatable bonding. A compatible metallurgy could be supplied just at these points to facilitate the needs of the bonding process.

A method of manufacture for the integral standoffs 44 is to protect small areas of the original base material while etching the rest of the set of traces 32. Not reducing the trace thickness at the standoff points leaves the raised standoffs 44. The standoffs 44 may be arranged so as to occur only over the rigid region 29 of the load beam 20, while avoiding the spring region 28. Each trace 33 also may bend to reduce the Z-axis distance to the load beam 20 as it bridges over the spring region 28. In this way, thickness and profile, and therefore stiffness, may be increased at the rigid region 29, and reduced at the spring region 28. Also the traces may be shaped as "S"-curve spring members. In the "S" curve configuration, the set of traces 32 crosses the spring region 28 at an acute angle, thus reducing the stiffening effect vector.

To further control the stiffening effect of the gimbal-interconnect 30 and to allow varying resistances as necessary along the electrical path, the traces 33 may vary in thickness and width along the different regions.

Figure 2:
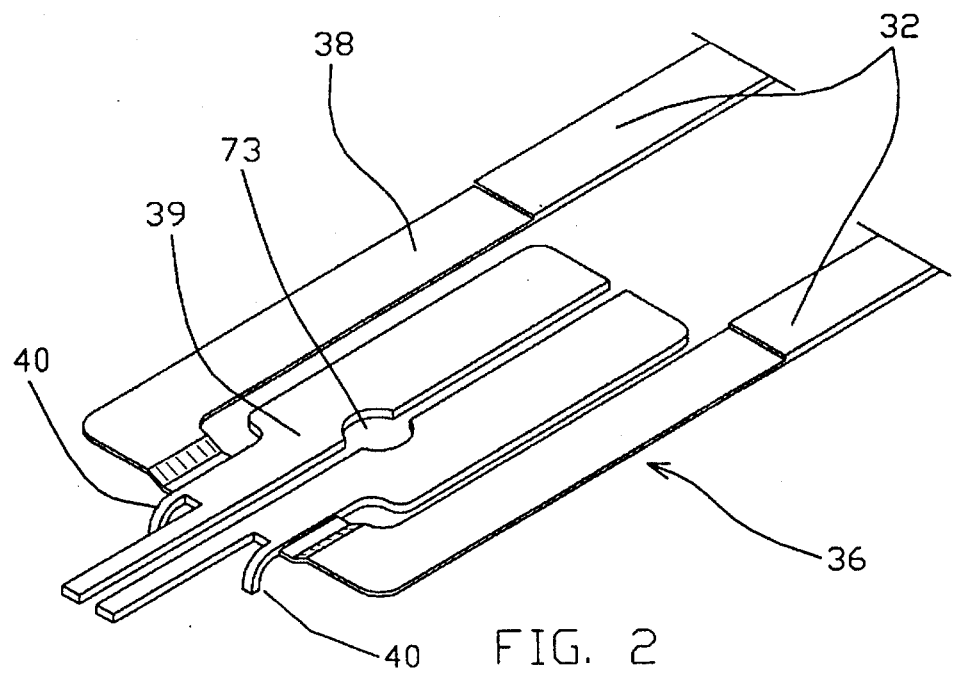
FIG. 2 is an enlarged detail view of the gimbal portion of the gimbal-interconnect assembly shown in FIG. 1.

In a preferred embodiment of FIGS. 1–3, the set of traces 32 contains two photochemically etched beryllium-copper alloy traces ≈12 micrometers thick with standoffs ≈50 micrometers thick and a ≈6.4 micrometer thick dielectrical and adhesive coating. The traces 33 become narrower in width and thinner in thickness along the load beam's spring region 28.

The distal end portion 25 of the load beam 20 in these figures is shaped as a projecting rectangular tongue 70. The tongue 70 includes an alignment and location hole 71 and an gimbal pivot 72. The pivot 72 creates a convex semi-spherical protuberance rising out of the first surface 22 of the load beam 20.

Better seen in FIG. 2, the gimbal portion 36 of this set of traces 32 includes a pair of symmetrical torsion arms 38 extending from the set of traces 32. Each arm 38 is designed to extend along the sides of the tongue 70, as seen in FIG. 3. At the distal end of the tongue 70, the arms 38 describe a 90 degree curve and spread into a pair of symmetrical flexure bond pads 39 shaped and arranged to provide a contact surface for the head assembly 12. The bond pads 39 can be any shape that will provide a suitable coupling and gimballing surface. In the embodiment of FIG. 2, they are shaped as back-to-back "P"s, with a semicircular indentation approximately at the middle of each back. The indentation defines a round clearance hole 73 that fits around and receives the gimbal pivot 72. This allows the head assembly 12 to swivel on the gimbal pivot 72. Connection tangs 40 extend in a soft radial break perpendicularly away from the pads 39 and towards the position of the head assembly 12. The tangs are located to facilitate connections to the head's electrical terminals 14.

FIGS. 4 and 5 show a different embodiment of the present invention. In it, the distal end portion 25 of the load beam 20 defines an aperture 75. The depicted aperture 75 is an octagon, slightly extended along the X-axis, but it could be a circle or other shape. The gimbal portion 36 of the set of traces 32 includes a pair of thin symmetrical torsion arms 38 extending from the set of traces. The arms 38 border the side edges of the aperture 75 and then describe a 90 degree curve near the midpoint of the X-dimension of the aperture. As they near the axis of symmetry, the arms 38 spread into a pair of symmetrical horizontal bond pads 39 shaped and arranged to provide a coupling surface for the head assembly 12.

Figure 7:
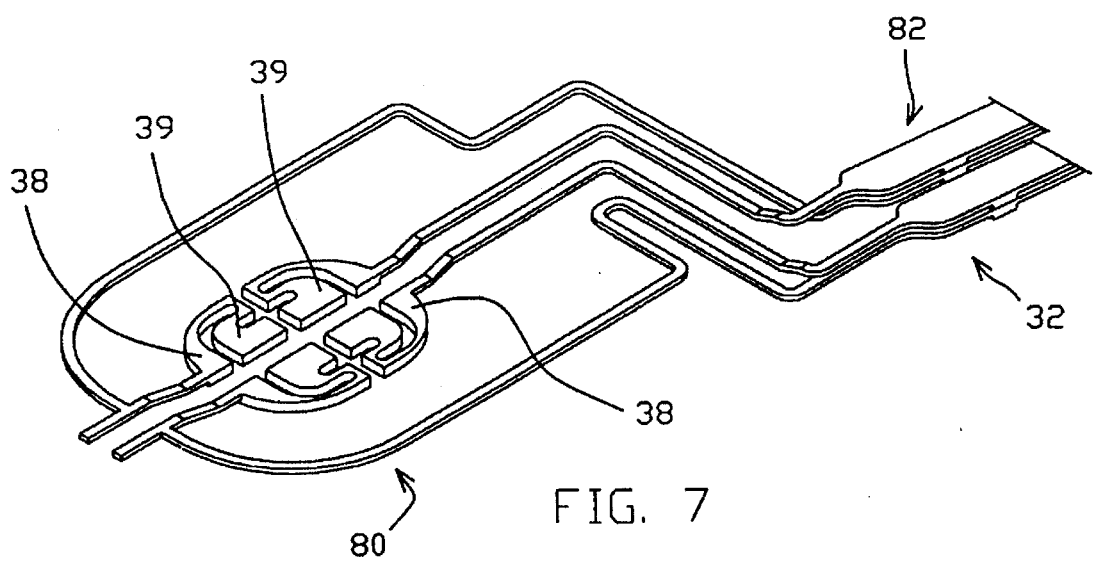
FIG. 7 is an enlarged detail perspective view of the gimbal portion of the multi-signal gimbal-interconnect assembly of FIG. 6.

For those HSAs that handle a large number of signals, the trace gimbal-interconnect 30 offers two options. One, it can add more generally parallel side-by-side traces to the set of traces 32. Two, for load beams that only provide a limited surface on which to place and route the interconnect, a multi-signal stacked array gimbal-interconnect assembly 80 may be manufactured. As shown in FIGS. 6–8, this multi-signal gimbal-interconnect assembly 80 includes additional sets of conductive traces 82 stacked and laminated over each other at the load beam portion 34 to form a multi-level array of sets. This reduces the footprint of the path occupied by the multi-signal gimbal interconnect assembly 80 on the load beam 20. In order to reduce the stiffness of the multi-signal beam 80, the individual traces 33 may fan out along stiffness sensitive regions, such as the spring region 28, in a spaced planar relationship parallel to the suspension assembly 10.

The multi-signal gimbal interconnect assembly 80 also may fan out at connection points. FIG. 6 shows the same load beam 20 of FIG. 4 having the distal end portion 25 shaped and arranged for supporting a gimbal flexure. The present embodiment comprises a first set of traces 32 and a second set of traces 82, each including a pair of electrically insulated generally parallel elongated substrateless conductors constructed of a single layer spring material. The preferred materials have a tensile strength and a yield strength similar to those of the suspension assembly. Both sets of traces include a connector region 37 at their proximal end, a gimbal region 36 at their distal end, and a load beam region 34. The load beam region 34 of the first set of traces 32 extends over and matches the surface topology of at least a section of the first surface 22 of the load beam 20. The load beam region of the second set of traces 82 matches and mounts atop the load beam region of the first set of traces 32. The connector region 37 of the second set of traces 82 steps down from the first set of traces 32 and extends in the same plane proximally along the connector region of the first set of traces 32.

As seen in FIG. 7, the gimbal region 36 of each set of traces fans out (and becomes torsion arms 38) into a gimbal flexure pattern that is symmetrical along a longitudinal axis bisecting the suspension assembly. Again, there are a variety of possible gimballing patterns. The pattern in this version, which can be better appreciated in FIG. 7, resembles a circle with four quadrants framed inside of an arched frame. The traces 33 spread at their distal end into flexure bond pads 39 (shaped generally like a "5" or a "2"). The combined gimbal regions of each trace form a gimbal flexure for coupling and providing gimballing support to the floating head assembly.

Figure 9:
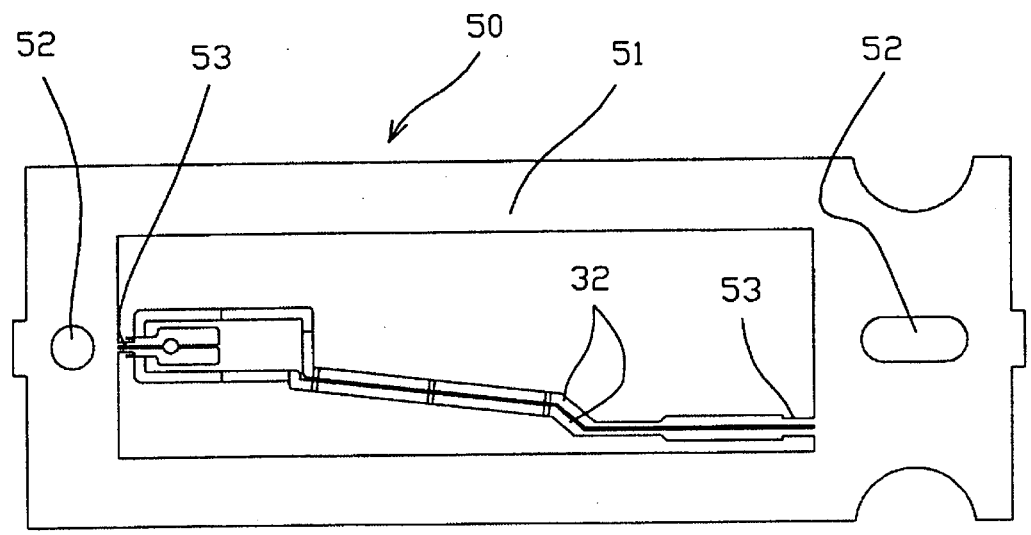
FIG. 9 is a bottom view of a version of a gimbal-interconnect, including an "O"-shaped support brace.
Figure 10:
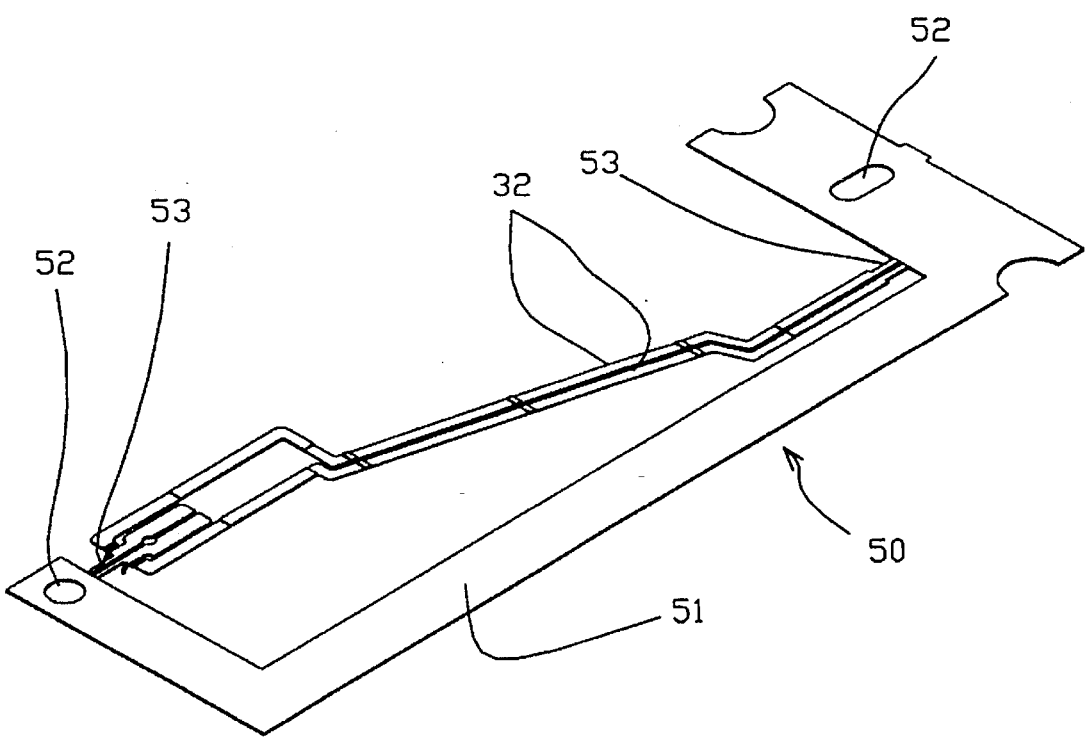
FIG. 10 is a perspective view of a version of a gimbal-interconnect, including an "C"-shaped support brace.

As illustrated by FIGS. 9 and 10, the set of traces 32 may be attached to a support brace 50 to further improve the ease of handling and resistance to deformation of the traces 33. The brace 50 serves to secure the set of traces 32, alone or along with the load beam 20, to a protective chassis during assembly. The support brace 50 brackets the set of traces 32 and provides a carrier element for alignment and fabrication. The brace 50 includes a planar border 51 that may be O-shaped, C-shaped, L-shaped or even I-shaped extending along at least one side of the set of traces 32. The brace also has tooling registration holes 52 and support tabs 53 attaching and securing the set of traces 32 to the planar border 51. The brace 50 is designed so it can straddle the load beam 20 and so that the border 51 does not interfere with mounting the set of traces 32 to the load beam 20. Once the set of traces 32 and the load beam 20 are together, the brace 50 can serve as a carrier element for the whole HSA. When no longer required, the brace 50 can be removed by disengaging the support tabs 53.

Figure 12:
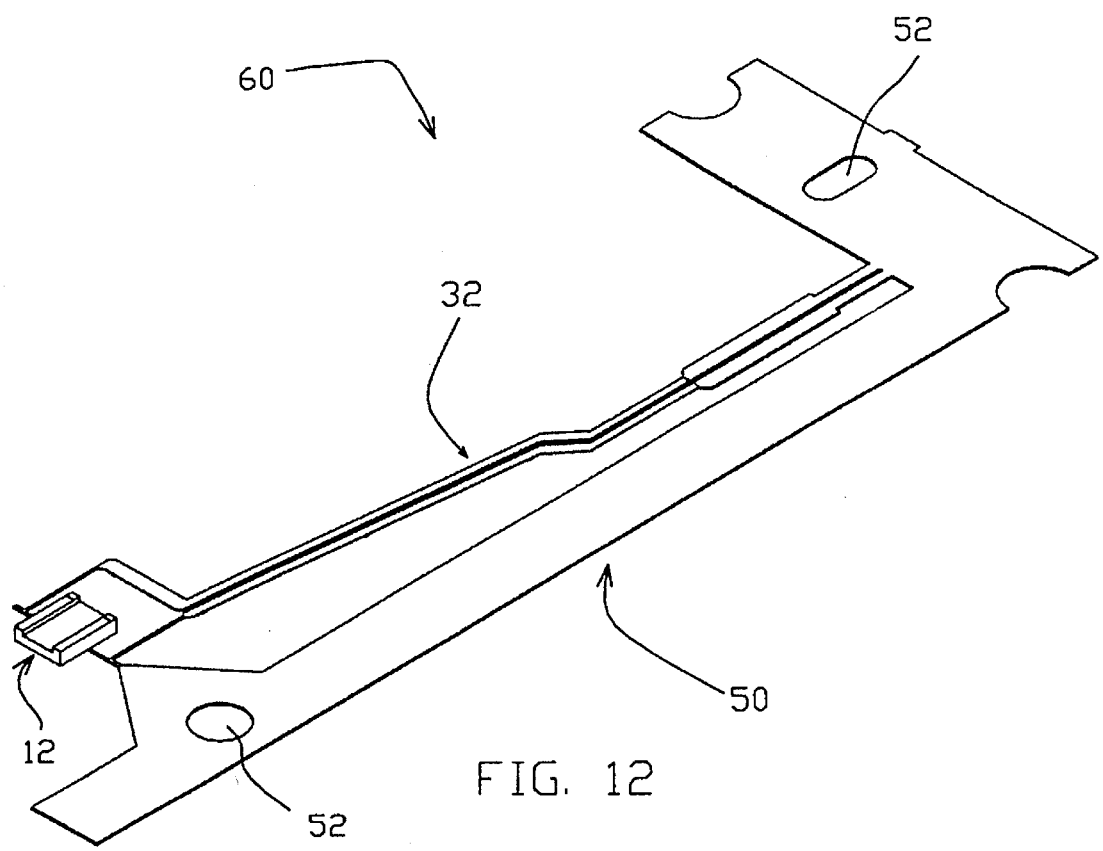
FIG. 12 is a perspective view of a head gimbal-interconnect harness.

One of the preferred methods of manufacture involves photochemically etching the brace 50 simultaneously out of a same sheet of conductive metal (preferably BeCu) as the set of traces 32. This allows automated etching on a long strip of metal of a series of interconnect assemblies alongside each other and separated and supported by shared brace borders. Secured by the support brace 50, the gimbal-interconnect 30 is so strong that a head assembly 12 may be directly electrically and mechanically coupled to the gimbal portion 36 of the interconnect (specifically to the bond pads 39 and/or tangs 40), prior to attaching the gimbal-interconnect 30 to the load beam 20. Attaching a head assembly 12 to a gimbal-interconnect 30 creates the sturdy head interconnect harness 60 depicted in FIG. 12 ready for attachment to a variety of suspension assemblies.

Figure 13:
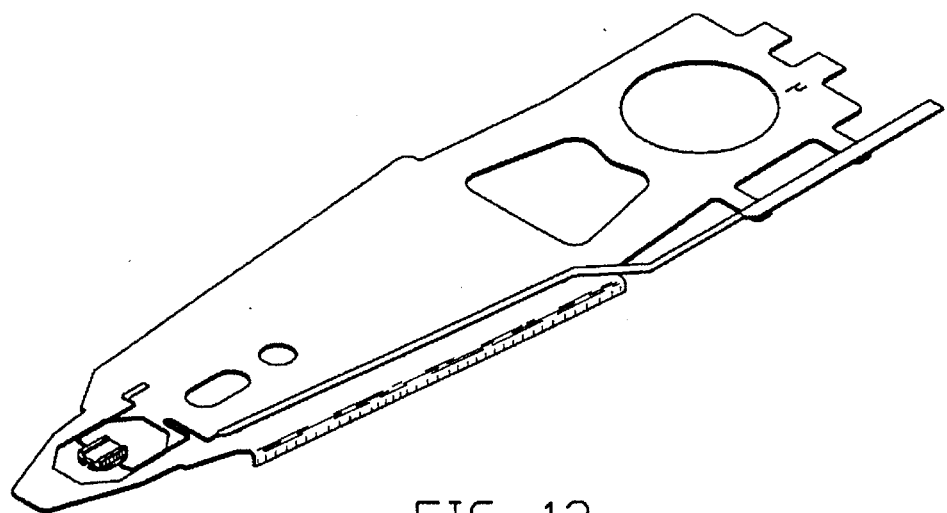
FIG. 13 is a perspective view of a HSA according to the present invention which uses the suspension assembly as an additional conductor.

A way that the present invention can take advantage of the electrical isolation between the suspension assembly and the gimbal-interconnect is to use the suspension assembly itself as a conductor. This HSA version, shown in FIG. 13, includes an electrically insulated suspension assembly made of a conductive material. The suspension assembly would be configured and arranged for supporting a gimbal flexure. The HSA would further include a gimbal flexure and electrical interconnect assembly 30 mounted to the suspension assembly and a head assembly 12 including a plurality of electrical terminals, the head assembly 12 supported by and electrically coupled to the gimbal-interconnect 30. This HSA would further include a connecting means from head assembly 12 to the suspension assembly, wherein the suspension assembly functions as an additional conductor of electrical signals. The connecting means could be an individual trace with a gimbal portion or another type of conductor which would not interfere with the gimballing motion.

Figure 14:
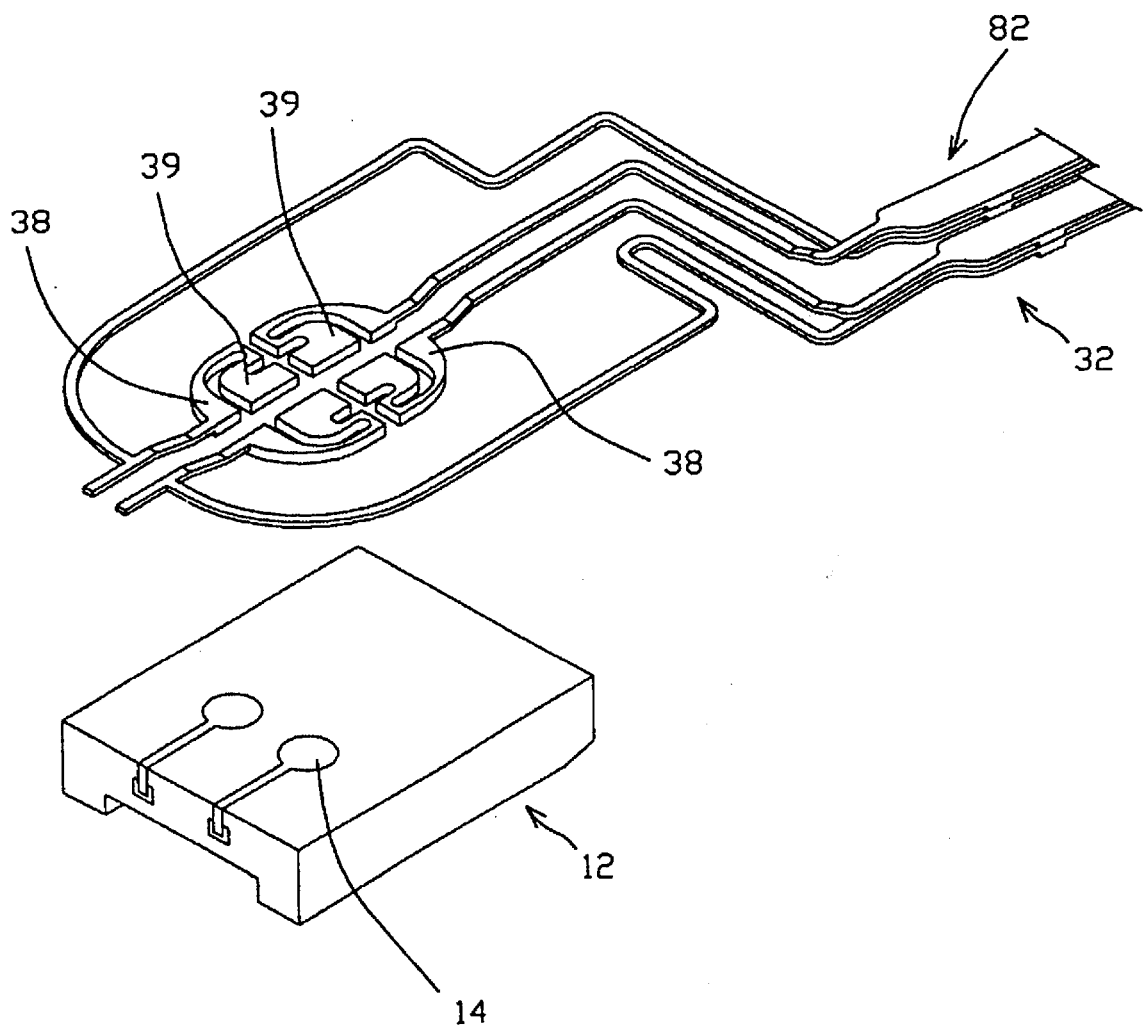
FIG. 14 is a exploded detail view of the gimbal portion of a gimbal-interconnect format including a grounding trace attaching to a head assembly.

Most HSAs use the suspension assembly as an electrical ground. But since the gimbal-interconnect 30 and the head assembly 12 it suspends are electrically isolated from the suspension assembly, an additional trace can be used to electrically ground the slider of the head assembly 12 to prevent electrostatic buildup. FIG. 14 shows the distal end of an embodiment of this trace and how it connects to the slider. The trace connects to the slider at one end using electrically conducting epoxy and to the load beam 20, the actuator arm, the chassis or frame, or to other appropriate ground at the other end. The conductive epoxy also can be spot placed between uninsulated portions of the torsion arms and the load beam 20. The trace of FIG. 14 is part of a multi-layered gimbal-interconnect assembly similar to those of FIGS. 6 and 7.

The advantages of the present invention become more apparent during manufacturing of a HSA. There are two preferred ways to incorporate the gimbal-interconnect 30 into the manufacturing process. In the first, the gimbal-interconnect 30 can be attached to a standard suspension assembly design prior to mechanical and/or electrical head bond. The suspension assembly is first fabricated with generally accepted design practices. The trace gimbal-interconnect 30 usually attaches to the first surface 22 of the load beam 20, usually the side facing the disk, although in differently designed HSAs it may attach on the opposite side. In this format, the suspension assembly with the prebonded gimbal-interconnect 30 is presented for follow-up mechanical and electrical head bonding. The manufacturing advantages of this process include eliminating the costs, complicated fixturing, and usable yield loss associated with the use of standard wires or flex circuits.

A second method of manufacture of a HSA involves bonding the head assembly 12 to the gimbal-interconnect 30 in the braced format prior to the attachment of the gimbal-interconnect to a suspension assembly. This creates the head interconnect harness 60 described above and depicted in FIG. 12. To complete the head suspension assembly, the head interconnect harness 60 only needs to be mechanically bonded to the surface of the load beam 20. The strength of the gimbal-interconnect 30 also allows the interconnect harness 60 to be offered to the industry as an independent product for attachment to suspension assemblies.

The head interconnect harness 60 removes the slider bonding step from the manufacturing of suspension assemblies. It replicates the present standard practice where the twisted wire pair is bonded to the slider prior to bonding the slider to the suspension. This avoids the effects of potentially damaging slider fixturing and ultrasonic welding operations which could unpredictably shift the slider static attitude from gimbal spring damage. Decoupling the slider bond sequence from the individual suspensions also offers assembly ease by improving the access to the set of traces 32 and spacing the traces 33 in a repeatable, stepped strip format ideal for automation. This also allows offsetting the head assembly 12 relative to the gimbal pivot 72 to achieve uniform flying height.

The advantages of the gimbal-interconnect over prior interconnect assemblies are numerous. First, it eliminates the problems of adapting an interconnect assembly to a gimbal flexure without affecting the spring characteristics. Since BeCu so closely resembles the mechanical behavior of the stainless steel typically used in suspension assemblies, the gimbal-interconnect performs as well as traditional gimbal flexures. It also reduces manufacturing steps by eliminating the need to add a separate gimbal or to incorporate fragile integral conductors somewhere along the load beam's manufacturing process.

The gimbal-interconnect reduces the mass of the whole suspension assembly. Elimination of the thick, constraining polyimide supporting layer reduces material costs and processing steps. Absence of a substrate backing results in a gimbal-interconnect that can be less stiff, have a lower profile, and have a lower mass than comparable flex circuits. Use of integral trace connector tangs 40 or bond pads 39 for electrical connection allow a low-profile geometrically controllable and consistent service loop that will not cause fluctuating impedances, loads, or biases, and that will not tangle or break.

Since most dielectric materials have sufficient dielectric strength to provide satisfactory insulation at thicknesses orders of magnitude smaller than those needed to support flex circuits (2.5 micrometers needed for insulation vs. 25 micrometers minimum needed for support for flexible circuitry), the gimbal-interconnect utilizes only a thin spray coating of dielectric. The use of a dielectric-adhesive further reduces the cross-section of the traces. This, in turn, reduces the height profile and shifts the shear axis of the suspension assembly back towards the suspension centerline.

The gimbal-interconnect 30 offers additional stiffness reduction via selective trace width/thickness reduction, "S"-curve spring members, and standoff placement. Trace width alterations additionally result in resistance reduction along its length. Capacitance to ground is also reduced through the integral standoff features and use of an air gap as a dielectric.

A noticeable feature of the gimbal-interconnect 30 is its structural strength and its ability to resist plastic deformation. The use of high strength materials makes it resistant to variable bias stresses during applied force inputs. The use of a support brace 50 allows pre-formed construction to avoid mechanical displacement and load effects upon the suspension assembly. The gimbal-interconnect strength permits the set of traces 32 or the head interconnect harness 60 to be fabricated independently. This strength and the thin profile and flexibility features allow the stacking of multiple sets of conductors for multi-signal complex slider applications.

The gimbal-interconnect 30 greatly aids in processing and manufacturing. A substrateless interconnect fabrication process avoids the need for imprecise dielectric patterning. Compared to polyimide, metal can be more easily formed to very precise specifications. This results in consistent interconnect routing and mating along the X, Y, and Z axis of the suspension assembly and offers flexibility to address multiple suspension designs. Multiple slider formats also can be addressed through ultrasonic bonded formed tabs or solder attachment. Partial etching can be used to define variable conductor thickness along length and for fine feature patterning.

BeCu has good conductivity, yet has ample tensile and yield strength to be resilient, resist plastic deformation, and support itself at small thicknesses. But, since the gimbal-interconnect 30 can be manufactured separately and only added in the later steps of production, even materials with lower strengths are less likely to be damaged during the manufacturing processes.

Utilization of a strong, preshaped interconnect removes the need for the complex automated machinery needed to place other kinds of conductors. The gimbal-interconnect 30 provides definitive placement and routing along the geometry of the load beam 20. Attachment of the gimbal-interconnect 30 can progress as in tubeless wire interconnects with localized adhesive application, but in a more controlled, repeatable format. Unlike tubeless automated bonding, the gimbal-interconnect 30 does not require tensioning devices to ensure flatness, straightness, or proper placement. The material strength characteristics and the ability to provide for a more substantive trace cross-section in the rigid region 29 of the load beam 20 allow for inherent stability without the need for substantial tooling assistance in routing.

In conclusion, the gimbal-interconnect assembly 30 offers improved mechanical characteristics while offering the desired electrical performance. Additionally the gimbal-interconnect 30 simplifies and makes more efficient the manufacturing of HSAs.

The invention is not to be taken as limited to all of the details thereof as modifications and variations thereof may be made by workers skilled in the art without departing from the spirit or scope of the invention.

What is claimed is:

1. A combined gimbal flexure and electrical interconnect assembly for attachment to a disk drive head suspension assembly including a load beam and for supporting a head slider supported adjacent a distal end thereof, the gimbal flexure and interconnect assembly comprising, in combination:

a set of load beam traces including one or more electrically insulated, generally parallel, elongated, low-profile conductors each of which is constructed of a single layer of spring material shaped and arranged for conforming to the surface of the load beam and each of which is supported by the load beam; and a set of gimbal traces, each of which extends from a corresponding load beam trace and projects from the load beam at the distal end thereof, each of said gimbal traces terminating in a pad portion adapted for attachment to the body of said slider for supporting said slider for gimballed motion relative to said load beam and for conducting electrical signals to and from the slider, the portion of the gimbal traces between the load beam and the pad portion constructed and arranged for exclusively supporting the pad portion thereof for gimbal movement.

2. The gimbal flexure and electrical interconnect assembly of claim 1 wherein the spring material for the set of traces has a tensile strength and a yield strength approximately equal to those strengths applicable to the material used in the suspension assembly.

3. The gimbal flexure and electrical interconnect assembly of claim 1 wherein the material for the set of traces is a beryllium copper alloy.

4. The gimbal flexure and electrical interconnect assembly of claim 1 wherein the gimbal traces include one or more symmetrical torsion arms extending from the set of load beam traces, at least one of said torsion arms electrically insulated from the load beam, each torsion arm constructed and arranged for providing a symmetrical gimballing spring and having a distal end spreading into an enlarged horizontal bond pad for providing a contact surface for the head slider.

5. The gimbal flexure and electrical interconnect assembly of claim 1 further comprising at least one additional set of conductive traces, the additional sets stacked and laminated over each other forming a stacked array of sets.

6. The interconnect assembly of claim 1, the set of traces having regions of different widths.

7. The interconnect assembly of claim 1, the set of traces having regions of different thicknesses.

8. A head suspension assembly comprising:

a suspension assembly configured and arranged for supporting a gimbal flexure;

the gimbal flexure and electrical interconnect assembly of claim 1 mounted to the suspension assembly; and a head assembly including a plurality of electrical terminals, the head assembly supported by and electrically connected to the gimbal flexure and interconnect assembly.

9. The head suspension assembly of claim 8 further including a connecting means from the head assembly to the suspension assembly, wherein the suspension assembly is made of a conductive material and is electrically insulated and the suspension assembly functions as an additional conductor of electrical signals.

10. A disk drive including the head suspension assembly of claim 8.

11. A disk drive head suspension assembly, said suspension assembly comprising:

a load beam having a distal end portion shaped and arranged for supporting a gimbal flexure;

a combined gimbal flexure and electrical interconnect assembly including a set of traces including one or more electrically insulated, generally parallel, elongated, substrateless low-profile conductors constructed of a single layer spring material, the set of traces including a load beam portion having load beam traces shaped and arranged to extend over and match the surface topology of at least a section of the first surface of the load beam, and a gimbal portion having gimbal traces extending from the load beam traces and projecting from a distal end of the load beam and adapted for exclusively supporting a disk drive head slider attached to a distal extremity thereof, the gimbal traces shaped and arranged for acting as a gimbal flexure means providing exclusive gimballing support for a disk drive head and for providing conductive paths for electrically coupling to electrical terminals on the disk drive head.

12. The suspension assembly of claim 11, the distal end portion of the load beam comprises a projecting rectangular tongue including a gimbal pivot creating a convex semispherical protuberance rising out of the first surface of the load beam, the gimbal portion of the set of traces including a pair of symmetrical torsion arms extending from the set of traces, each arm describing a 90 degree curve and spreading into a pair of symmetrical flexure bond pads placed back-to-back and shaped and arranged to provide a contact surface for a head assembly, the flexure bond pads having indentations defining a clearance hole shaped and arranged to receive the gimbal pivot for allowing the head assembly to swivel on the gimbal pivot.

13. The suspension assembly of claim 11, the distal end portion of the load beam defining an aperture and the gimbal portion of the set of traces including a pair of thin symmetrical torsion arms extending from the set of traces, each arm first bordering the aperture and then describing a 90 degree curve over the aperture and spreading into a pair of symmetrical bond pads shaped and arranged to provide a bonding surface for the head assembly.

14. A multi-signal combined gimbal flexure and electrical interconnect assembly for attachment to a disk drive head suspension assembly, wherein said suspension assembly includes a load beam, the combined gimbal flexure and electrical interconnect, comprising:

a first and a second set of traces, each set of traces including a pair of electrically insulated elongated substrateless low-profile conductors constructed of a single layer of spring material, both sets of traces including a connector region at their proximal end, a gimbal region at their distal end, and a load beam region, the load beam region of the first set of traces extends over and matches the surface topology of at least a section of the first surface of the load beam; the load beam region of the second set of traces matches and mounts atop the load beam region of the first set of traces; the connector region of the second set of traces steps down from the first set of traces and extends in the same plane proximally along the connector region of the first set of traces, and the conductors at the gimbal region of each set of traces fan out into torsion arms describing a gimbal flexure pattern that is symmetrical along a longitudinal axis bisecting the suspension assembly, a distal end of the torsion arms spreading out into a flexure bond pad; the gimbal regions combining for coupling with and providing gimballing support to the head assembly, said torsion arms and said load beam constructed and arranged such that gimbal regions of the traces provide the exclusive mechanical support for a head assembly attached to the flexure bond pad.

15. A disk drive head suspension assembly, said suspension assembly including the combined multi-signal gimbal flexure and electrical interconnect assembly of claim 12 and a load beam having a first surface and a projecting distal end portion defining a magnetic head receiving aperture therein; wherein the torsion arms suspend the bond pads over the aperture.

16. A head gimbal-interconnect harness for mounting a combined electrical interconnect and gimbal flexure assembly and a head assembly to a suspension assembly, wherein said suspension assembly includes a load beam, said load beam having a first surface and a distal end portion shaped and arranged for supporting a gimbal flexure, said head gimbal-interconnect harness comprising:

a set of traces including one or more electrically insulated elongated substrateless low-profile conductors constructed of a single layer spring material, the set of traces including a load beam portion shaped and arranged to extend over and to match the surface topology of at least a section of the first surface of the load beam, and a gimbal portion located at a distal end of the set of traces shaped and arranged as the sole gimbal flexure means for mechanically coupling with the distal end portion of the load beam, providing the exclusive gimballing support for the floating head assembly, and electrically coupling to electrical terminals on the head assembly;

a support brace for providing a carrier element for alignment and fabrication of the set of conductive traces, said support brace bracketing the set of conductive traces and including a planar border extending along at least one side of the set of conductive traces, tooling registration holes, and support tabs attaching the set of conductive traces to the planar border, wherein the support brace is detached from the set of conductive traces by disengaging the support tabs; and a head assembly having a slider, a transducer and electrical terminals, wherein the head assembly attaches to the gimbal portion of the set of traces and the gimbal portion electrically connects to the electrical terminals on the head assembly.

\* \* \* \* \*